US008530296B2

United States Patent
Hao et al.

(10) Patent No.: US 8,530,296 B2
(45) Date of Patent: Sep. 10, 2013

(54) HIGH VOLTAGE TRANSISTOR USING DILUTED DRAIN

(71) Applicant: Texas Instruments Incorporated, Dallas, TX (US)

(72) Inventors: Pinghai Hao, Plano, TX (US); Sameer Pendharkar, Allen, TX (US); Binghua Hu, Plano, TX (US); Qingfeng Wang, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/765,054

(22) Filed: Feb. 12, 2013

(65) Prior Publication Data

US 2013/0157429 A1    Jun. 20, 2013

Related U.S. Application Data

(63) Continuation of application No. 13/160,759, filed on Jun. 15, 2011, now Pat. No. 8,399,924.

(60) Provisional application No. 61/355,858, filed on Jun. 17, 2010.

(51) Int. Cl.
*H01L 21/8238* (2006.01)

(52) U.S. Cl.
USPC ............. 438/199; 438/301; 438/E21.632

(58) Field of Classification Search
USPC ........... 438/197, 199, 301, 305, 373, E21.632
See application file for complete search history.

(56) References Cited

U.S. PATENT DOCUMENTS 6,838,731 B1 * 1/2005 D'Anna et al. ............... 257/343
2012/0273878 A1   11/2012 Mallikarjunaswamy

* cited by examiner

*Primary Examiner* — Hoai V Pham
(74) *Attorney, Agent, or Firm* — Jacqueline J. Garner; Wade J. Brady, III; Frederick J. Telecky, Jr.

(57) ABSTRACT

An integrated circuit containing an extended drain MOS transistor may be formed by forming a drift region implant mask with mask fingers abutting a channel region and extending to the source/channel active area, but not extending to a drain contact active area. Dopants implanted through the exposed fingers form lateral doping striations in the substrate under the mask fingers. An average doping density of the drift region under the gate is at least 25 percent less than an average doping density of the drift region at the drain contact active area. In one embodiment, the dopants diffuse laterally to form a continuous drift region. In another embodiment, substrate material between lateral doping striations remains an opposite conductivity type from the lateral doping striations.

10 Claims, 8 Drawing Sheets

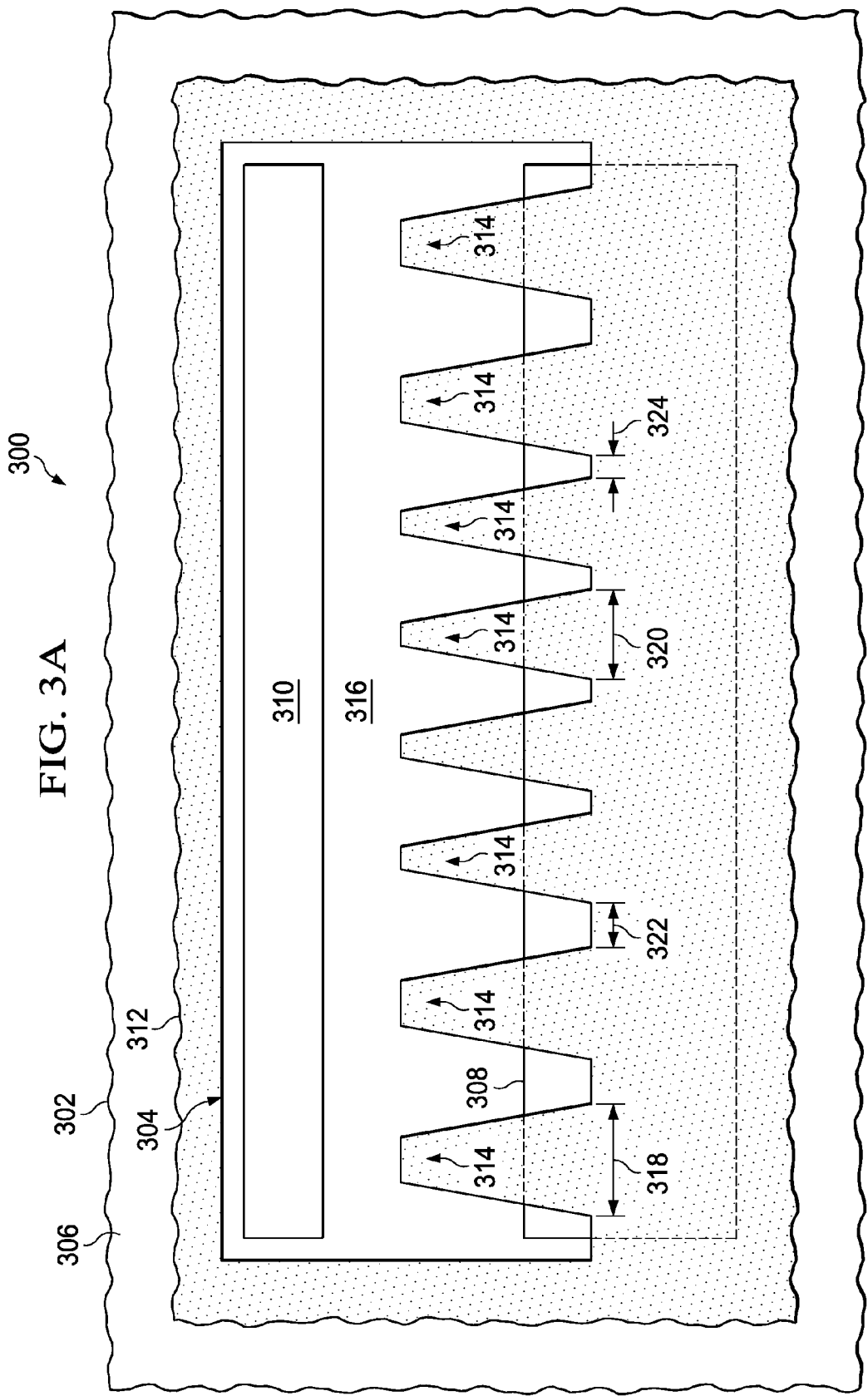

HIGH VOLTAGE TRANSISTOR USING DILUTED DRAIN

CROSS-REFERENCE TO RELATED APPLICATIONS

This application is a continuation of Nonprovisional application Ser. No. 13/160,759 filed Jun. 15, 2011, now U.S. Pat. No. 8,399,924 issued Mar. 19, 2013, which incorporates by reference and claims the benefit of priority under U.S.C. §119(e) of U.S. Provisional Application 61/355,858 (Texas Instruments docket number TI-69055PS, filed Jun. 17, 2010).

FIELD OF THE INVENTION

This invention relates to the field of integrated circuits. More particularly, this invention relates to extended drain MOS transistors in integrated circuits.

BACKGROUND OF THE INVENTION

An integrated circuit may contain an extended drain metal oxide semiconductor (MOS) transistor which operates at a drain voltage significantly above a maximum gate voltage for the transistor. For example, an extended drain transistor may operate at a drain voltage of 20 volts and have a maximum gate voltage of 3.3 volts. The extended drain transistor may include a drain drift region between a drain contact active area and the gate; the drain drift region may deplete when drain bias is applied to the drain contact active area so as to reduce an electric field across a gate dielectric layer under the gate. Forming the drain drift region to provide desired values of drain operating voltage, breakdown voltage when the transistor is turned off, also referred to as BVDSS, breakdown voltage when the transistor is turned on, also referred to as BVDII, and area of the transistor, may require tradeoffs which undesirably increase a fabrication cost or complexity of the integrated circuit or decrease performance of the integrated circuit.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit containing an extended drain MOS transistor may be formed by a process sequence including forming a drift region implant mask so as to expose an existing top surface of the integrated circuit in an area to be ion implanted to dope the drift region. The drift region implant mask has fingers of exposed areas alternating with fingers of mask material in an area which will subsequently be abutting a channel region of the extended drain MOS transistor. The alternating exposed fingers and mask fingers extend beyond a source/channel active area but do not extend to a drain contact active area disposed opposite from the source/channel active area. A drift region ion implant process is performed which implants dopants for the drift region into a substrate of the integrated circuit under the area exposed by the drift region implant mask. The mask fingers block the implanted dopants from the substrate directly under the mask fingers. During one or more subsequent anneal processes, the implanted dopants diffuse and become activated. In one embodiment, dopants from adjacent lateral doping striations diffuse laterally sufficiently to counterdope the substrate and form a continuous drift region. In another embodiment, substrate material between the lateral doping striations remains an opposite conductivity type from the lateral doping striations, with a lateral cumulative doping density between adjacent doped fingers from $1 \times 10^{12}$ cm$^{-2}$ to $5 \times 10^{12}$ cm$^{-2}$.

DESCRIPTION OF THE VIEWS OF THE DRAWING

FIG. 3A and FIG. 3B are top views of an integrated circuit containing an extended drain MOS transistor, hereafter referred to as the MOS transistor, formed according to a further embodiment.

DETAILED DESCRIPTION OF EXAMPLE EMBODIMENTS

Figure 1A:
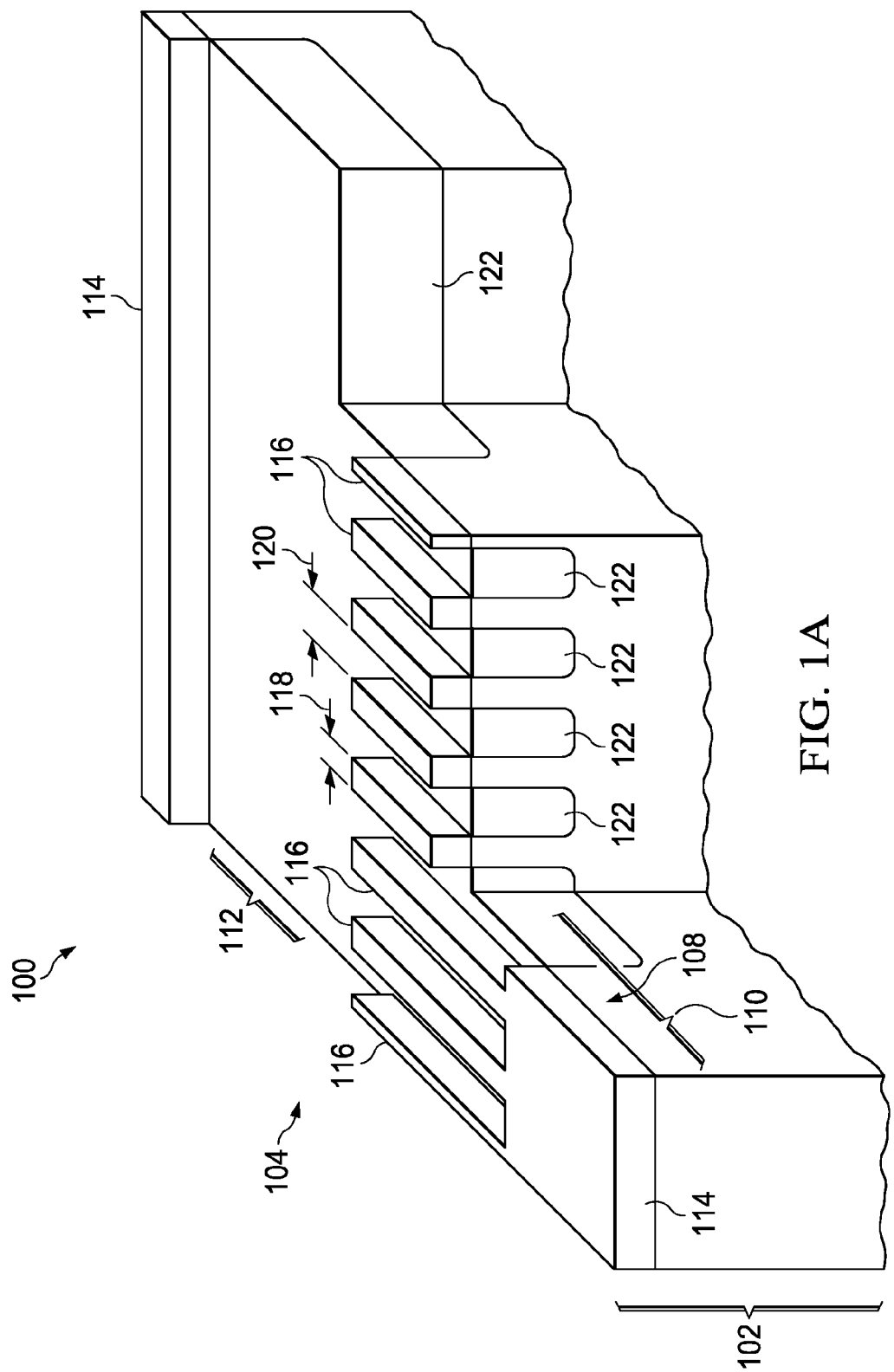
FIG. 1A and FIG. 1B are cutaway perspectives of an integrated circuit containing an extended drain MOS transistor, hereafter referred to as the MOS transistor, formed according to an embodiment, depicted in successive stages of fabrication.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit containing an extended drain MOS transistor may be formed by a process sequence including forming a drift region implant mask so as to expose an existing top surface of the integrated circuit in an area to be ion implanted to dope the drift region. The drift region implant mask has fingers of exposed areas alternating with fingers of mask material in an area which will subsequently be abutting a channel region of the extended drain MOS transistor. The alternating exposed fingers and mask fingers extend beyond a source/channel active area but do not extend to a drain contact active area disposed opposite from the source/channel active area. A drift region ion implant process is performed which implants dopants for the drift region into a substrate of the integrated circuit under the area exposed by the drift region implant mask. The mask fingers block the implanted dopants from the substrate directly under the mask fingers. During one or more subsequent anneal processes, the implanted dopants diffuse and become activated. An average doping density of the drift region under the gate is at least 25 percent less than an average doping density of the drift region at the drain contact active area. In one embodiment, the dopants diffuse laterally sufficiently to counterdope the substrate and form a continuous drift region. In another embodiment, substrate material between drift fingers remains an opposite conductivity type from the lateral doping striations, with a lateral cumulative doping density between adjacent doped fingers from $1 \times 10^{12}$ cm$^{-2}$ to $5 \times 10^{12}$ cm$^{-2}$. A dilution ratio is a ratio of an average density of n-type dopants in a drain drift region at a source/channel active area to an average density of the n-type dopants in the drain drift region at a drain contact active area of an MOS transistor formed according to an embodiment.

A second extended drain MOS transistor may be formed in the integrated circuit as described above, having a lower ratio of an average doping density of the drift region under the gate to an average doping density of the drift region at the drain contact active area compared to a similar ratio for the first transistor.

For the purposes of this description, the term "substantially equal" is understood to mean equal within manufacturing tolerances or unintended variations encountered during fabrication of embodiments.

For the purposes of this description, the term "existing top surface" of a device during a recitation of a fabrication sequence of the device is understood to refer to a combination of exposed top surfaces of elements in and on the device at the step being recited. The term "existing top surface" may include exposed top surfaces of sacrificial elements which are not present in the device when fabrication is completed.

This description recites formation of n-channel extended drain MOS transistors. It will be recognized that p-channel extended drain MOS transistors may be formed according the recited embodiments with a appropriate changes in polarities of dopants and conductivity types.

Figure 1B:
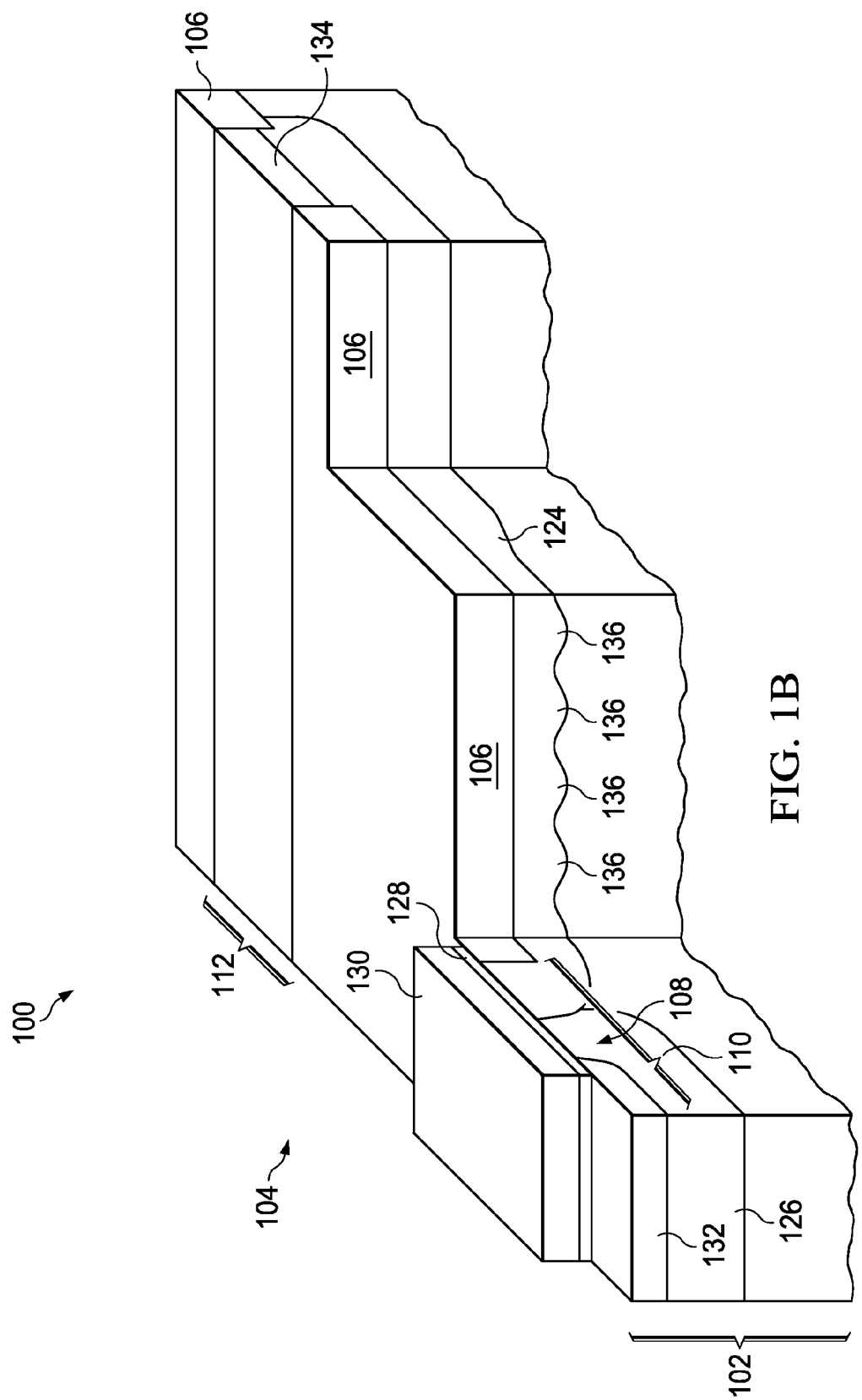

FIG. 1A and FIG. 1B are cutaway perspectives of an integrated circuit containing an extended drain MOS transistor, hereafter referred to as the MOS transistor, formed according to an embodiment, depicted in successive stages of fabrication. Referring to FIG. 1A, the integrated circuit 100 is formed in and on a semiconductor substrate 102. The substrate 102 may be a single crystal silicon wafer, a silicon-on-insulator (SOI) wafer, a hybrid orientation technology (HOT) wafer with regions of different crystal orientations, or other material appropriate for fabrication of the integrated circuit 100. The semiconductor material of the substrate 102 proximate to a top surface of the substrate 102 is p-type, with a doping density, for example, between $1 \times 10^{14}$ cm$^{-3}$ and $1 \times 10^{16}$ cm$^{-3}$. The MOS transistor 104 includes an area defined for a source/channel active area 110 and an area defined for a drain contact active area 112, at a top surface of the substrate 102. The source/channel active area 110 includes a channel region 108 disposed at the top surface of the substrate 102.

A drift region implant mask 114 is formed over the top surface of the substrate 102 so as to expose an area to be ion implanted to dope a drift region. The area to be ion implanted extends from proximate to the drain contact active area 112 to proximate to the source/channel active area 110. The area to be ion implanted may overlap the drain contact active area 112 and/or may overlap the source/channel active area 110. The drift region implant mask 114 includes mask fingers 116 which are disposed over the substrate 102 at the source/channel active area 110, and extend a portion of a distance to the drain contact active area 112. A ratio of a width 118 of the mask fingers 116 to a width 120 of the spaces between the mask fingers 116 may be between 0.33 and 3. The mask fingers 116 may be, for example, between 300 nanometers and 3 microns wide, with spaces between adjacent mask fingers 116 also between 300 nanometers and 3 microns wide, as long as the ratio of the width 118 of the mask fingers 116 to the width 120 of the spaces between the mask fingers 116 is maintained between 0.33 and 3.

A drift region ion implant process is performed which ion implants n-type dopants such as phosphorus and arsenic through the exposed area of the drift region implant mask 114 to form a drift implanted layer 122 in the substrate 102. The mask fingers 116 block the implanted dopants from the substrate 102 directly under the mask fingers 116.

Referring to FIG. 1B, an anneal process is performed on the integrated circuit 100 which causes the implanted dopants in the drift implanted layer 122 of FIG. 1A to diffuse and become electrically activated, so as to form an n-type drain drift region 124 of the MOS transistor 104. The anneal operation may include, for example, a thermal drive step which heats the substrate 102 to a temperature between 1000 C and 1200 C for a time between 30 minutes and 4 hours. In the instant embodiment, dopants from implanted regions between the mask fingers 116 of FIG. 1A diffuse laterally so as to counterdope the substrate 102, as depicted in FIG. 1B.

Optional field oxide 106 may be formed at the top surface of the substrate 102 over the drain drift region 124. The field oxide 106 may include silicon dioxide between 250 and 600 nanometers thick, and may be formed by shallow trench isolation (STI) or local oxidation of silicon (LOCOS) processes. In STI processes, silicon dioxide may be deposited by high density plasma (HDP) or high aspect ratio process (HARP). The MOS transistor 104 includes a first opening in the field oxide 106 at the source/channel active area 110. The MOS transistor 104 also includes a second opening in the field oxide 106 at the drain contact active area 112.

A p-type body region 126 of the MOS transistor 104 is formed in the substrate 102 at the channel region 108, for example by ion implanting p-type dopants such as boron into the substrate 102 followed by an anneal operation to activate the implanted p-type dopants. The anneal may include, for example, a rapid thermal anneal step which heats the substrate 102 to a temperature between 900 C and 1100 C for a time period between 5 seconds and 30 seconds.

A gate dielectric layer 128 of the MOS transistor 104 is formed on the substrate 102 over the channel region 108 and a portion of the drain drift region 124 abutting the channel region 108. The gate dielectric layer 128 may be one or more layers of silicon dioxide ($SiO_2$), silicon oxy-nitride (SiON), aluminum oxide ($Al_2O_3$), aluminum oxy-nitride (AlON), hafnium oxide (HfO), hafnium silicate (HfSiO), hafnium silicon oxy-nitride (HfSiON), zirconium oxide (ZrO), zirconium silicate (ZrSiO), zirconium silicon oxy-nitride (ZrSiON), a combination of the aforementioned materials, or other insulating material. The gate dielectric layer 128 may include nitrogen as a result of exposure to a nitrogen containing plasma or a nitrogen containing ambient gas at temperatures between 50 C and 800 C. The gate dielectric layer 128 may be formed by any of a variety of gate dielectric formation processes, for example thermal oxidation, plasma nitridation of an oxide layer, and/or dielectric material deposition by atomic layer deposition (ALD). The gate dielectric layer 128 may be, for example, between 2.7 and 100 nanometers thick, so as to enable a maximum gate voltage, relative to a source of the MOS transistor 104, between 1 and 40 volts. A version of the MOS transistor 104 designed to operate with a gate voltage of 1 volt may have a gate dielectric layer 128 approximately 2.7 nanometers thick. Another version of the MOS transistor 104 designed to operate with a gate voltage of 5 volts may have a gate dielectric layer 128 approximately 14 nanometers thick. A further version of the MOS transistor 104 designed to operate with a gate voltage of 12 volts may have a gate dielectric layer 128 approximately 30 nanometers thick. Yet another version of the MOS transistor 104 designed to operate with a gate voltage of 40 volts may have a gate dielectric layer 128 approximately 100 nanometers thick.

A gate 130 of the MOS transistor 104 is formed on the gate dielectric layer 128. The gate 130 may include, for example, one or more layers of polycrystalline silicon, commonly referred to as polysilicon, metal silicide such as tungsten silicide, titanium silicide, cobalt silicide and/or nickel silicide, and/or metal such as aluminum, tungsten and/or titanium nitride. The gate 130 may overlap the field oxide 106 adjacent to the channel region 108, as depicted in FIG. 1B. In other versions of the instant embodiment, the gate 130 may be recessed from the field oxide 106 or may be substantially coincident with the field oxide 106.

An n-type source region 132 of the MOS transistor 104 is formed in the substrate 102 adjacent to the gate 130 opposite from the drain drift region 124. An n-type drain contact region 134 is formed in the substrate 102 in the drain contact active area 112. Average doping densities in the source region 132 and the drain contact region 134 may be, for example, between $1 \times 10^{19}$ cm$^{-3}$ and $1 \times 10^{22}$ cm$^{-3}$. The source region 132 and the drain contact region 134 may be formed concurrently, for example by ion implanting n-type dopants such as phosphorus and arsenic into the substrate, followed by a source/drain anneal operation to activate the n-type dopants. The source/drain anneal operation may include, for example, a flash or laser anneal step which heats the substrate 102 to a temperature between 1000 C and 1100 C for a time period between 10 milliseconds and 5 seconds.

An average doping density of the drain drift region 124 at the source/channel active area 110 is at least 25 percent less than an average doping density of the drain drift region 124 at the drain contact active area 112. The drain drift region 124 at the source/channel active area 110 has lateral doping striations 136 which have a doping density at least 15 percent higher than regions of the drain drift region 124 between the lateral doping striations 136. The lateral doping striations 136 result from the blocking of the ion implanted dopants for the drain drift region 124 by the mask fingers 116 of FIG. 1A. The lateral doping striations 136 extend from the source/channel active area 110 to the drain contact active area 112 a lateral distance determined by a length of the mask fingers 116.

Versions of the instant embodiment which are free of field oxide and which do include metal silicide, not shown, on the drain contact active area 112 and source region 132 may form the metal silicide so as to block metal silicide from the top surface of the substrate 102 between the drain contact active area 112 and the gate 130. For example, a dielectric silicide blocking layer, not shown, may be formed over the substrate 102 between the drain contact active area 112 and the gate 130 prior to formation of the metal silicide.

During operation of the integrated circuit 100, applying a drain bias to the drain contact region 134 causes the drain drift region 124 to be depleted. Forming the drain drift region 124 to have the lower average doping density under the gate 130 compared to at the drain contact active area 112 may advantageously provide a reduced area of the MOS transistor 104 compared to an MOS transistor with substantially equal average doping densities under a gate and at a drain contact active area. Forming the drain drift region 124 to have diluted doping under the gate 130 using the mask fingers 116 of FIG. 1A may advantageously reduce a fabrication cost and complexity of the integrated circuit 100.

Forming the mask fingers 116 of FIG. 1A closer to the drain contact active area 112 may advantageously improve the BVDSS value of the transistor MOS 104. Forming the mask fingers 116 further from the drain contact active area 112 may advantageously improve the BVDII value of the MOS transistor 104. A desired balance between BVDSS and BVDII values may advantageously be obtained by adjusting a lateral extent of the mask fingers 116 relative to the drain contact active area 112.

Figure 2A:
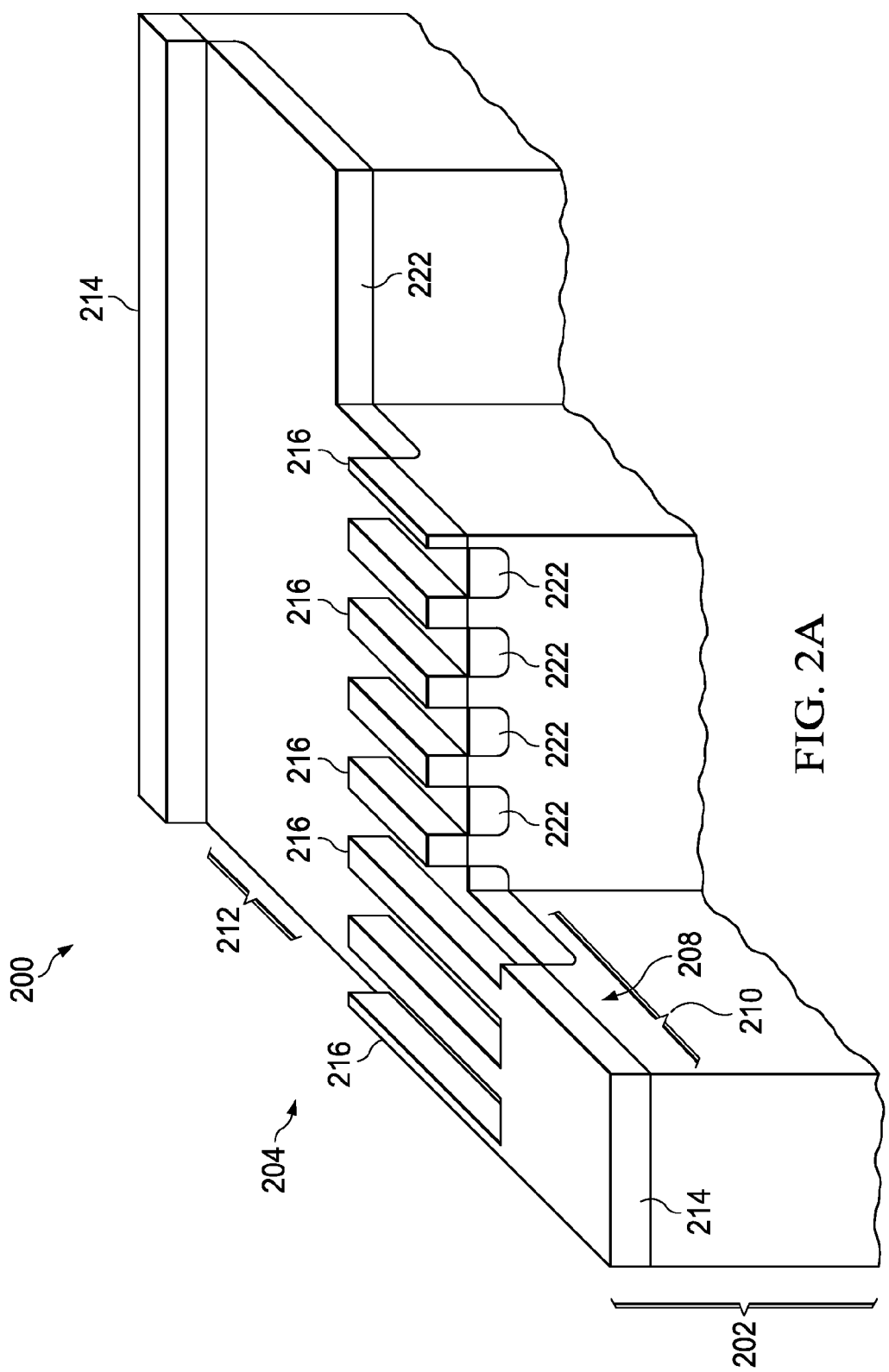
FIG. 2A and FIG. 2B are cutaway perspectives of an integrated circuit containing an extended drain MOS transistor, hereafter referred to as the MOS transistor, formed according to another embodiment, depicted in successive stages of fabrication.
Figure 2B:
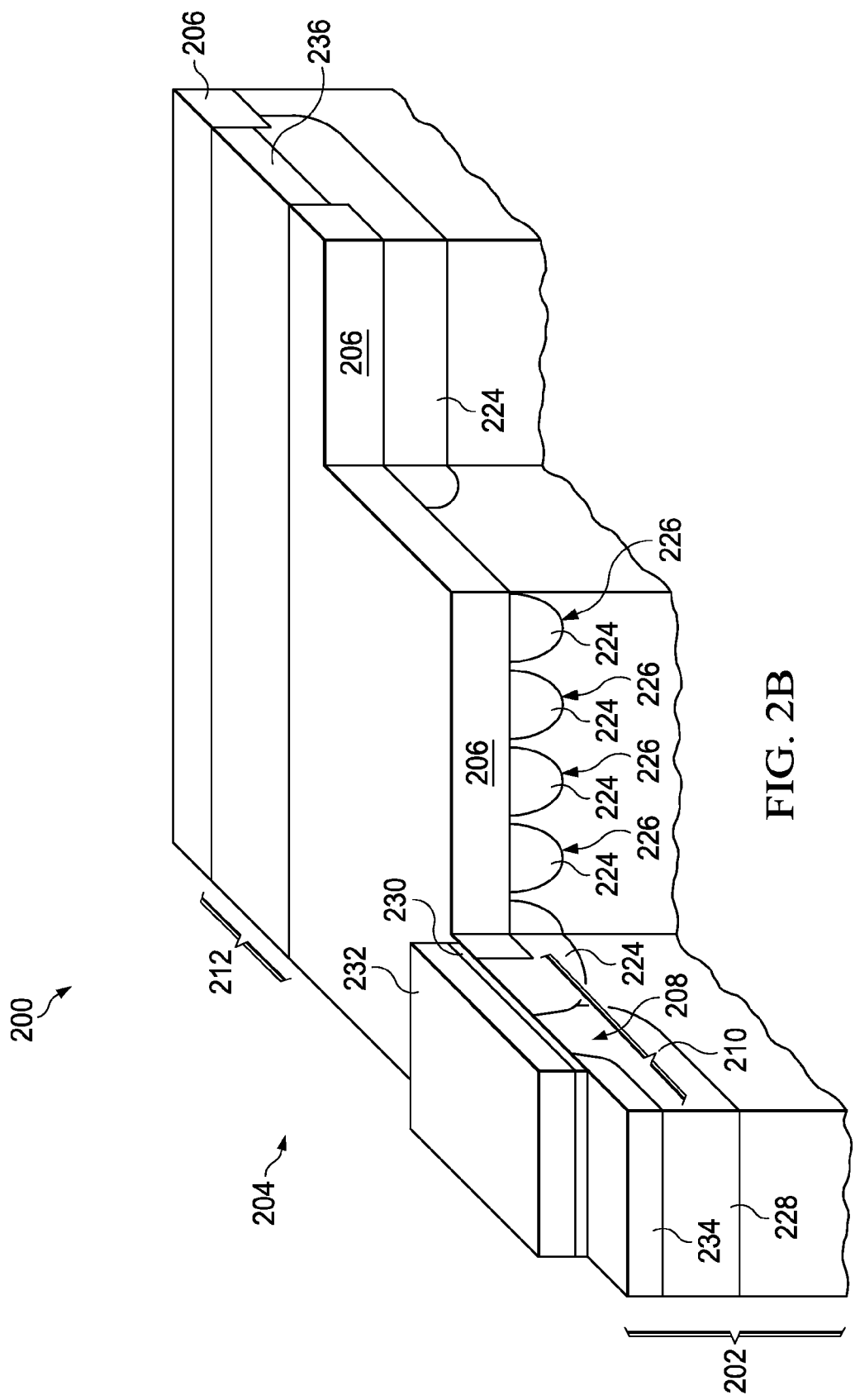

FIG. 2A and FIG. 2B are cutaway perspectives of an integrated circuit containing an extended drain MOS transistor, hereafter referred to as the MOS transistor, formed according to another embodiment, depicted in successive stages of fabrication. Referring to FIG. 2A, the integrated circuit 200 is formed in and on a semiconductor substrate 202 as described in reference to FIG. 1A. The MOS transistor 204 includes a source/channel active area 210, which further includes a channel region 208, and a drain contact active area 212 disposed opposite from the source/channel active area 210, as described in reference to FIG. 1A.

A drift region implant mask 214 with mask fingers 216 is formed over the top surface of the substrate 202 so as to expose an area to be ion implanted to dope a drift region, as described in reference to FIG. 1A. A drift region ion implant process is performed which ion implants n-type dopants such as phosphorus and arsenic through the exposed area of the drift region implant mask 214 to form a drift implanted layer 222 in the substrate 202. The mask fingers 216 block the implanted dopants from the substrate 202 directly under the mask fingers 116.

Referring to FIG. 2B, an anneal process is performed, as described in reference to FIG. 1B, on the integrated circuit 200 which causes the implanted dopants in the drift implanted layer 222 of FIG. 2A to diffuse and become electrically activated, so as to form an n-type drain drift region 224 of the MOS transistor 204. In the instant embodiment, dopants from implanted regions between the mask fingers 216 of FIG. 2A diffuse laterally so as to form n-type lateral doping striations 226 which are laterally separated by p-type substrate 202. The lateral doping striations 226 extend from the source/channel active area 210 toward the drain contact active area 212 a lateral extent determined by a length of the mask fingers 216 of FIG. 2A. A lateral cumulative doping density of the substrate 202 between adjacent lateral doping striations 226 may be from $1 \times 10^{12}$ cm$^{-2}$ to $5 \times 10^{12}$ cm$^{-2}$. The lateral cumulative doping density of the substrate 202 between adjacent lateral doping striations 226 is the integrated doping density along a horizontal line from a lateral edge of one instance of the lateral doping striations 226 through the substrate 202 to a lateral edge of an adjacent instance of the lateral doping striations 226, where the horizontal line is parallel to the top surface of the substrate 202 and perpendicular to the lateral edges of the lateral doping striations 226.

Optional field oxide 206 may be formed in the substrate 202 as described in reference to FIG. 1A. The field oxide 206 is adjacent to, but laterally separated from, the channel region 208. The MOS transistor 204 includes a first opening in the field oxide at the source/channel active area 210 and a second opening in the field oxide 206 at the drain contact active area 212 disposed opposite from the source/channel active area 210.

A p-type body region 228 of the MOS transistor 204 is formed in the substrate 202 at the channel region 208, as described in reference to FIG. 1B. A gate dielectric layer 230 of the MOS transistor 204 is formed on the substrate 202 over the channel region 208 and a portion of the drain drift region 224 abutting the channel region 208, as described in reference to FIG. 1B. A gate 232 of the MOS transistor 204 is formed on the gate dielectric layer 230, as described in reference to FIG. 1B. An n-type source region 234 of the MOS transistor 204 is formed in the substrate 202 adjacent to the gate 232 opposite from the drain drift region 224, and an n-type drain contact region 236 is formed in the substrate 202 in the drain contact active area 212, as described in reference to FIG. 1B.

An average doping density of the drain drift region 224 under the gate 232 is at least 25 percent less than an average doping density of the drain drift region 224 at the drain contact active area 212. During operation of the integrated circuit 200, applying a drain bias to the drain contact region 236 causes the drain drift region 224 to be depleted, and the substrate 202 between the lateral doping striations 226 to be depleted. The advantages described in reference to the embodiment of FIG. 1B may also accrue to the instant embodiment.

Versions of the instant embodiment which are free of field oxide and which do include metal silicide, not shown, on the drain contact active area 212 and source region 234 may form the metal silicide so as to block metal silicide from the top surface of the substrate 202 between the drain contact active area 212 and the gate 232, as discussed in reference to FIG. 1B.

Figure 3B:
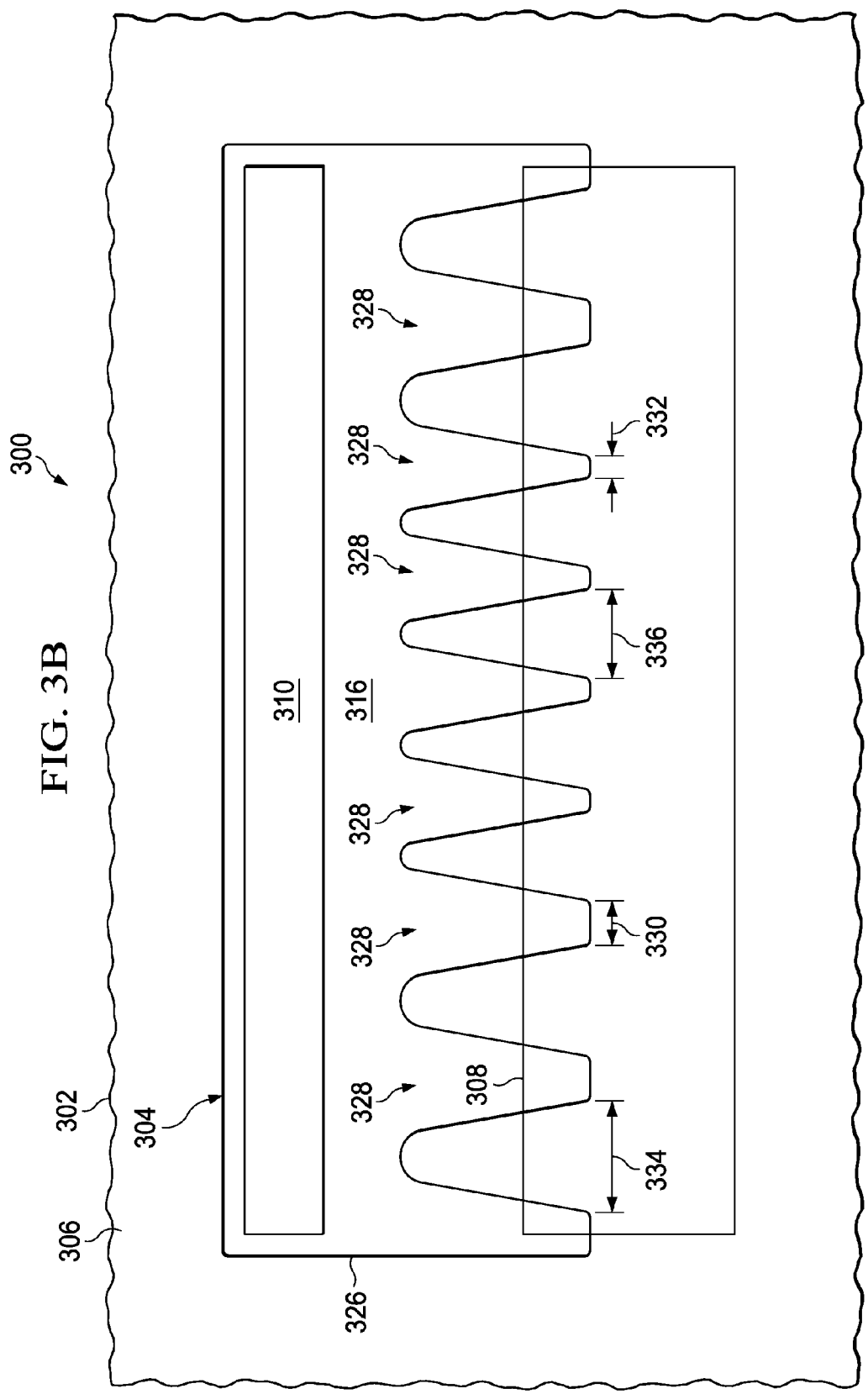

FIG. 3A and FIG. 3B are top views of an integrated circuit containing an extended drain MOS transistor, hereafter referred to as the MOS transistor, formed according to a further embodiment. Referring to FIG. 3A, the integrated circuit 300 is formed in an on a substrate 302 as described in reference to FIG. 1A. The MOS transistor 304 a source/channel active area 308 and a drain contact active area 310.

A drift region implant mask 312, depicted in FIG. 3A with a stippled pattern, with mask fingers 314 is formed over the substrate 302 as described in reference to FIG. 1A. The drift region implant mask 312 exposes an area 316 to be ion implanted with n-type dopants to form a drift region as described in reference to FIG. 1A and FIG. 1B or in reference to FIG. 2A and FIG. 2B. In the instant embodiment, the mask fingers 314 are tapered so as to vary a dilution ratio of the ion implanted n-type dopants from a drain end of the mask fingers 314 to a channel end of the mask fingers 314. Varying the dilution ratio as described here may advantageously enable forming the MOS transistor 304 in a smaller area compared to an MOS transistor with mask fingers of constant width.

In one version of the instant embodiment, a first width 318 of a first instance of the mask fingers 314 may be larger than a second width 320 of a second instance of the mask fingers 314, as depicted in FIG. 3A. Similarly, a first space 322 between a first pair of mask fingers 314 may be larger than a second space 324 between a second pair of mask fingers 314, as depicted in FIG. 3.

FIG. 3B depicts the integrated circuit after an anneal operation as described in reference to FIG. 1B which activates the implanted dopants. A drain drift region 326 has tapered lateral doping striations 328 resulting from the ion implanted dopants being blocked by the mask fingers 314 of FIG. 3A. The tapered lateral doping striations 328 are wider at ends closer to the drain contact active area 310 than at ends at the source/channel active area 308.

In the version of the instant embodiment depicted in FIG. 3A and FIG. 3B, a first width 330 of a first instance of the lateral doping striations 328 may be larger, for example by at least 25 percent, than a second width 332 of a second instance of the lateral doping striations 328, as depicted in FIG. 3B. Similarly, a first substrate region 334 between a first pair of lateral doping striations 328 may be larger than a second substrate region 336 between a second pair of lateral doping striations 328, as depicted in FIG. 3B. Varying widths of the lateral doping striations 328 and/or varying widths of substrate regions between adjacent lateral doping striations 328 may advantageously enable balancing a dilution ratio of the ion implanted dopants so as to provide a more uniform depletion of the drift region during operation of the integrated circuit 300.

Figure 4A:
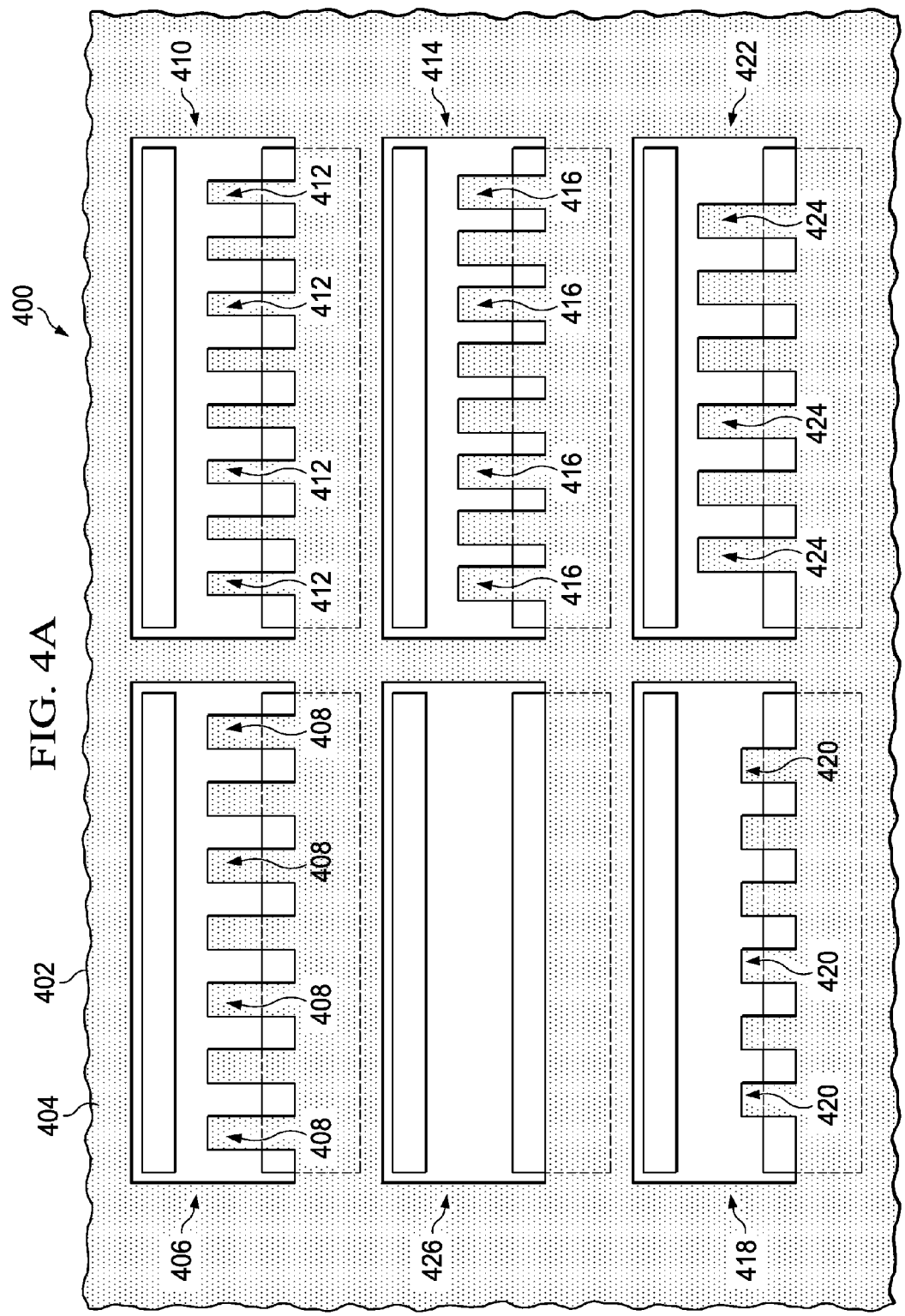
FIG. 4A and FIG. 4B are top views of an integrated circuit containing a plurality of extended drain MOS transistors, hereafter referred to as MOS transistors, formed according to embodiments.
Figure 4B:
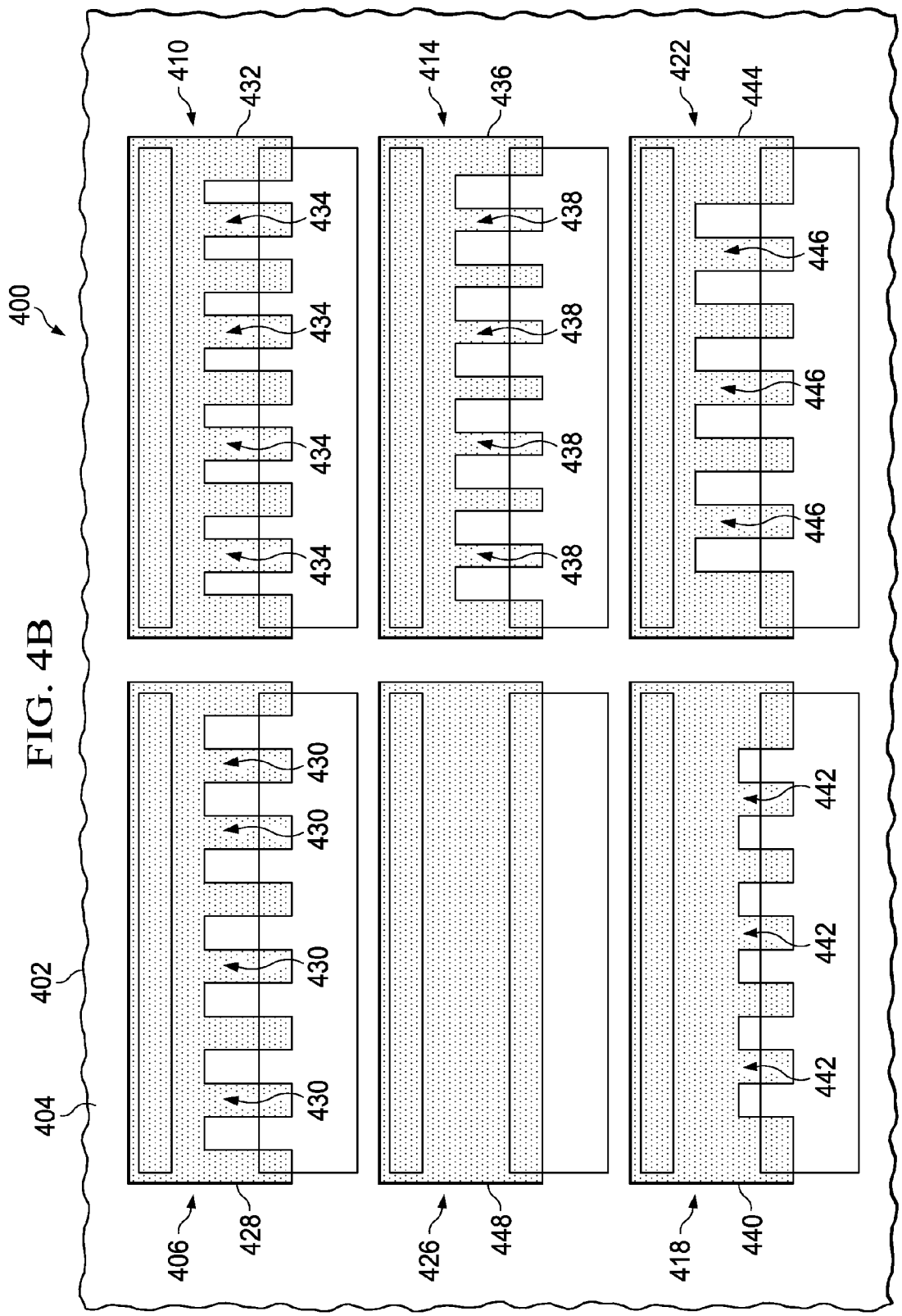

FIG. 4A and FIG. 4B are top views of an integrated circuit containing a plurality of extended drain MOS transistors, hereafter referred to as MOS transistors, formed according to embodiments. Referring to FIG. 4A, the integrated circuit 400 is formed in and on a substrate 402 as described in reference to FIG. 1A. The integrated circuit 400 is depicted after formation of a drift region implant mask 404, depicted in FIG. 4A with a stippled pattern for clarity, as described in reference to FIG. 1A. N-type dopants are implanted through exposed areas of the drift region implant mask 404 as described in reference to FIG. 1A and FIG. 2A to form drain drift regions in the MOS transistors.

The integrated circuit 400 includes a first MOS transistor 406 formed according to an embodiment. The drift region implant mask 404 includes a first plurality of mask fingers 408 in the first MOS transistor 406, as described in reference to FIG. 1A, so as to provide a first dilution ratio of the n-type dopants in the first MOS transistor 406. The first plurality of mask fingers 408 have a first length, so as to provide a first ratio of BVDSS to BVDII values for the first MOS transistor 406.

The integrated circuit 400 may also include a second MOS transistor 410 formed according to an embodiment. The drift region implant mask 404 includes a second plurality of mask fingers 412 in the second MOS transistor 410 so as to provide a second dilution ratio of the n-type dopants in the second MOS transistor 410. The second plurality of mask fingers 412 are more narrow than the first plurality of mask fingers 408, while spaces between the second plurality of mask fingers 412 are substantially equal to spaces between the first plurality of mask fingers 408, so that the second dilution ratio is less than the first dilution ratio.

The integrated circuit 400 may further include a third MOS transistor 414 formed according to an embodiment. The drift region implant mask 404 includes a third plurality of mask fingers 416 in the third MOS transistor 414 so as to provide a third dilution ratio of the n-type dopants in the third MOS transistor 414. The third plurality of mask fingers 416 are substantially equal to the first plurality of mask fingers 408, while spaces between the third plurality of mask fingers 416 are more narrow than spaces between the first plurality of mask fingers 408, so that the third dilution ratio is more than the first dilution ratio.

The integrated circuit 400 may also include a fourth MOS transistor 418 formed according to an embodiment. The drift region implant mask 404 includes a fourth plurality of mask fingers 420 in the fourth MOS transistor 418 which have a second length, which is less than the first length of the first plurality of mask fingers 408 in the first MOS transistor 406. The second length of the fourth plurality of mask fingers 420 provides a second ratio of BVDSS to BVDII values for the fourth MOS transistor 418 which is less than the first ratio of BVDSS to BVDII values for the first MOS transistor 406.

The integrated circuit 400 may further include a fifth MOS transistor 422 formed according to an embodiment. The drift region implant mask 404 includes a fifth plurality of mask fingers 424 in the fifth MOS transistor 422 which have a third length, which is greater than the first length of the first plurality of mask fingers 408 in the first MOS transistor. The third length of the fifth plurality of mask fingers 424 provides a third ratio of BVDSS to BVDII values for the fifth MOS transistor 422 which is greater than the first ratio of BVDSS to BVDII values for the first MOS transistor 406.

The integrated circuit 400 may also include a sixth MOS transistor 426 which is free of mask fingers of the drift region implant mask 404, so that dopants in a drain drift layer of the sixth transistor are not diluted.

FIG. 4B depicts the integrated circuit after an anneal operation as described in reference to FIG. 1B which activates the implanted dopants to form drain drift regions, shown in a dot fill for clarity, in the MOS transistors. The first MOS transistor 406 has a first drain drift region 428 with first plurality of lateral doping striations 430 which provide a first dilution ratio of the n-type dopants in the first drain drift region 428. The first plurality of lateral doping striations 430 have a first length so as to provide a first ratio of BVDSS to BVDII values for the first MOS transistor 406.

The second MOS transistor 410 has a second drain drift region 432 with second plurality of lateral doping striations 434 which provide a second dilution ratio of the n-type dopants in the second drain drift region 432. The second plurality of lateral doping striations 434 are substantially equal in width to the first plurality of lateral doping striations 430, while substrate regions between the second plurality of lateral doping striations 434 are narrower than substrate regions between the first plurality of lateral doping striations 430, so that the second dilution ratio is less, for example by at least 25 percent, than the first dilution ratio.

The third MOS transistor 414 has a third drain drift region 436 with third plurality of lateral doping striations 438 which provide a third dilution ratio of the n-type dopants in the third drain drift region 436. The third plurality of lateral doping striations 438 are narrower than the first plurality of lateral doping striations 430, while substrate regions between the third plurality of lateral doping striations 438 are substantially equal to substrate regions between the first plurality of lateral doping striations 430, so that the third dilution ratio is greater, for example by at least 25 percent, than the first dilution ratio.

The fourth MOS transistor 418 has a fourth drain drift region 440 with fourth plurality of lateral doping striations 442 which have a second length, which is less than the first length of the first plurality of lateral doping striations 430 in the first MOS transistor 406. The second length of the fourth plurality of lateral doping striations 442 provides a second ratio of BVDSS to BVDII values for the fourth MOS transistor 418 which is less, by at least 20 percent, than the first ratio of BVDSS to BVDII values for the first MOS transistor 406.

The fifth MOS transistor 422 has a fifth drain drift region 444 with fifth plurality of lateral doping striations 446 which have a third length, which is greater than the first length of the first plurality of lateral doping striations 430 in the first MOS transistor 406. The third length of the fifth plurality of lateral doping striations 446 provides a third ratio of BVDSS to BVDII values for the fifth MOS transistor 422 which is greater, by at least 20 percent, than the first ratio of BVDSS to BVDII values for the first MOS transistor 406.

The sixth MOS transistor 426 has a sixth drain drift region 448 which is free of lateral doping striations.

It will be recognized that features of the embodiment discussed in reference to FIG. 3 may be applied to any of the first MOS transistor 406 through the fifth MOS transistor 422. Forming any combination of the first MOS transistor 406 through the fifth MOS transistor 422 using one drift region implant mask 404 so as to adjust transistor parameters may advantageously reduce fabrication cost and complexity of the integrated circuit.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A process of forming an integrated circuit, comprising the steps of:

providing a semiconductor substrate, said substrate having a first conductivity type;

forming a first extended drain metal oxide semiconductor (MOS) transistor, by a process including the steps of:

forming a first drain drift region of said second conductivity type disposed in said substrate, by a process including the steps of:

forming a drift region implant mask over said substrate, so that said drift region implant mask exposes said substrate in an area to be ion implanted to dope a drain drift region of said first MOS transistor, said exposed area extending from an area defined for a first drain contact active area of said first MOS transistor to an area defined for a first source/channel active area of said first MOS transistor disposed opposite from said first drain contact active area, said first source/channel active area including a channel region at a top surface of said substrate, said drift region implant mask including a first plurality of mask fingers which are disposed over said substrate at said first source/channel active area and extend a portion of a distance to said first drain contact active area, so that said first plurality of mask fingers do not extend to said first drain contact active area;

performing an ion implant operation which ion implants dopants of a second conductivity type, opposite from said first conductivity type, through said exposed area of said drift region implant mask, so as to form a drift implanted layer in said substrate, so that said dopants are blocked from said substrate by said first plurality of mask fingers directly under said first plurality of mask fingers; and performing an anneal process on said integrated circuit which causes said implanted dopants in said drift implanted layer to diffuse and become electrically activated, so as to form said first drain drift region of said second conductivity type, said first drain drift region extending from said first drain contact active area to said first source/channel active area abutting said channel region, said first drain drift region including a first plurality of lateral doping striations, said first plurality of lateral doping striations extending a portion of a distance to said first drain contact active area to an extent determined by a length of said first plurality of mask fingers, so that that an average doping density of said first drain drift region at said first source/channel active area is at least 25 percent less than an average doping density of said first drain drift region at said first drain contact active area;

forming a body region in said substrate at said first source/channel active area, said body region having said first conductivity type;

forming a gate dielectric layer on said substrate over said channel region;

forming a gate on said gate dielectric layer; and forming a source region disposed in said first source/channel active area adjacent to said gate opposite from said first drain contact active area, said source region having said second conductivity type.

2. The process of claim 1, in which:

said first drain drift region is continuous between said first plurality of lateral doping striations; and said first plurality of lateral doping striations have a doping density at least 15 percent higher than regions of said first drain drift region between said first plurality of lateral doping striations.

3. The process of claim 1, in which:

said first plurality of lateral doping striations are laterally separated by regions of said substrate having said first conductivity type; and a lateral cumulative doping density of each instance of said substrate region between adjacent instances of said first plurality of lateral doping striations is from $1 \times 10^{12}$ cm$^{-2}$ to $5 \times 10^{12}$ cm$^{-2}$, where said lateral cumulative doping density of said substrate region between adjacent instances of said first plurality of lateral doping striations is an integrated doping density along a horizontal line from a lateral edge of one instance of said first plurality of lateral doping striations through said substrate region to a lateral edge of an adjacent instance of said first plurality of lateral doping striations, where said horizontal line is parallel to said top surface of said substrate and perpendicular to said lateral edges of said first plurality of lateral doping striations.

4. The process of claim 1, in which said first plurality of lateral doping striations have substantially equal widths at said first source/channel active area and at ends closer to said first drain contact active area.

5. The process of claim 1, in which:

said first plurality of mask fingers are tapered;

said first plurality of lateral doping striations are tapered so that said first plurality of lateral doping striations are wider at ends closer to said first drain contact active area than at said first source/channel active area.

6. The process of claim 1, in which a first width of a first instance of said first plurality of lateral doping striations is at least 25 percent larger than a second width of a second instance of said first plurality of lateral doping striations.

7. The process of claim 1, further including a step of forming a second extended drain MOS transistor, by a process including the steps of:

forming a second drain drift region disposed in said substrate, by a process including the steps of:

forming said drift region implant mask so that said drift region implant mask exposes said substrate in a second area to be ion implanted to dope a second drain drift region of said second MOS transistor, said second exposed area extending from an area defined for a second drain contact active area of said second MOS transistor to an area defined for a second source/channel active area of said second MOS transistor disposed opposite from said second drain contact active area, said second source/channel active area including a second channel region at a top surface of said substrate, said drift region implant mask being free of mask fingers in said second area to be ion implanted;

performing said ion implant operation so that said dopants of said second conductivity type are ion implanted through said second exposed area of said drift region implant mask, so as to form a second drift implanted layer in said substrate; and performing said anneal process so that said implanted dopants in said second drift implanted layer diffuse and become electrically activated, so as to form said second drain drift region of said second conductivity type, said second drain drift region extending from said second drain contact active area to said second source/channel active area, and abutting said second channel region, said second drain drift region being free of lateral doping striations;

forming a second body region in said substrate at said second source/channel active area, said second body region having said first conductivity type;

forming a second gate dielectric layer on said substrate over said second channel region;

forming a second gate on said second gate dielectric layer; and forming a second source region disposed in said second source/channel active area adjacent to said second gate opposite from said second drain contact active area, said second source region having said second conductivity type.

8. The process of claim 1, further including a step of forming a second extended drain MOS transistor, by a process including the steps of:

forming a second drain drift region disposed in said substrate, by a process including the steps of:

forming said drift region implant mask so that said drift region implant mask exposes said substrate in a second area to be ion implanted to dope a second drain drift region of said second MOS transistor, said second exposed area extending from an area defined for a second drain contact active area of said second MOS transistor to an area defined for a second source/channel active area of said second MOS transistor disposed opposite from said second drain contact active area, said second source/channel active area including a second channel region at a top surface of said substrate, said drift region implant mask including a second plurality of mask fingers which are disposed over said substrate between said second channel region and said second drain contact active area, and extend a portion of a distance to said second drain contact active area, so that said second plurality of mask fingers do not extend to said second drain contact active area, said mask fingers of said second plurality of mask fingers being wider than said mask fingers of said first plurality of mask fingers;

performing said ion implant operation so that said dopants of said second conductivity type are ion implanted through said second exposed area of said drift region implant mask, so as to form a second drift implanted layer in said substrate, so that said dopants are blocked from said substrate by said second plurality of mask fingers directly under said second plurality of mask fingers; and performing said anneal process so that said implanted dopants in said second drift implanted layer diffuse and become electrically activated, so as to form said second drain drift region of said second conductivity type, said second drain drift region extending from said second drain contact active area to said second source/channel active area, and abutting said second channel region, said second drain drift region including a second plurality of lateral doping striations, said second plurality of lateral doping striations extending a portion of a distance to said second drain contact active area to an extent determined by a length of said second plurality of mask fingers, so that that an average doping density of said second drain drift region at said second source/channel active area is at least 25 percent less than an average doping density of said second drain drift region at said second drain contact active area, said lateral doping striations of said second plurality of lateral doping striations being narrower than said lateral doping striations of said first plurality of lateral doping striations, so that a ratio of an average density of dopants in said second drain drift region at said second source/channel active area to an average density of dopants in said second drain drift region at said second drain contact active area is at least 25 percent less than a ratio of an average density of dopants in said first drain drift region at said first source/channel active area to an average density of dopants in said first drain drift region at said first drain contact active area;

forming a second body region in said substrate at said second source/channel active area, said second body region having said first conductivity type;

forming a second gate dielectric layer on said substrate over said second channel region;

forming a second gate on said second gate dielectric layer; and forming a second source region disposed in said second source/channel active area adjacent to said second gate opposite from said second drain contact active area, said second source region having said second conductivity type.

9. The process of claim 1, further including a step of forming a second extended drain MOS transistor, by a process including the steps of:

forming a second drain drift region disposed in said substrate, by a process including the steps of:

forming said drift region implant mask so that said drift region implant mask exposes said substrate in a second area to be ion implanted to dope a second drain drift region of said second MOS transistor, said second exposed area extending from an area defined for a second drain contact active area of said second MOS transistor to an area defined for a second source/channel active area of said second MOS transistor disposed opposite from said second drain contact active area, said second source/channel active area including a second channel region at a top surface of said substrate, said drift region implant mask including a second plurality of mask fingers which are disposed over said substrate between said second channel region and said second drain contact active area, and extend a portion of a distance to said second drain contact active area, so that said second plurality of mask fingers do not extend to said second drain contact active area, said mask fingers of said second plurality of mask fingers extending a greater distance toward said second drain contact active area than said first plurality of mask fingers extend toward said first drain contact active area;

performing said ion implant operation so that said dopants of said second conductivity type are ion implanted through said second exposed area of said drift region implant mask, so as to form a second drift implanted layer in said substrate, so that said dopants are blocked from said substrate by said second plurality of mask fingers directly under said second plurality of mask fingers; and performing said anneal process so that said implanted dopants in said second drift implanted layer diffuse and become electrically activated, so as to form said second drain drift region of said second conductivity type, said second drain drift region extending from said second drain contact active area to said second source/channel active area, said second drain drift region including a second plurality of lateral doping striations, said second plurality of lateral doping striations extending a portion of a distance to said second drain contact active area to an extent determined by a length of said second plurality of mask fingers, so that that an average doping density of said second drain drift region at said second source/channel active area is at least 25 percent less than an average doping density of said second drain drift region at said second drain contact active area, said lateral doping striations of said second plurality of lateral doping striations extending a greater distance toward said second drain contact active area than said first plurality of lateral doping striations of said first drain drift region extend toward said first drain contact active area, so that that a ratio of a BVDSS value to a BVDII value for said second MOS transistor is at least 25 percent greater than a ratio of a BVDSS value to a BVDII value for said first MOS transistor;

forming a second body region in said substrate at said second source/channel active area, said second body region having said first conductivity type;

forming a second gate dielectric layer on said substrate over said second channel region;

forming a second gate on said second gate dielectric layer; and forming a second source region disposed in said second source/channel active area adjacent to said second gate opposite from said second drain contact active area, said second source region having said second conductivity type.

10. The process of claim 1, in which:
said first conductivity type is p-type; and
said second conductivity type is n-type.

* * * * *